United States Patent
Zhang et al.

(10) Patent No.: US 10,941,479 B2
(45) Date of Patent: Mar. 9, 2021

(54) ION SOURCE ENHANCED ALCRSIN COATING WITH GRADIENT SI CONTENT AND GRADIENT GRAIN SIZE

(71) Applicants: Anhui University of Technology, Maanshan (CN); Anhui DuojinTuceng Technology Co. Ltd., Maanshan (CN); Anhui Hualing Automobile Co., Ltd., Maanshan (CN)

(72) Inventors: Shihong Zhang, Maanshan (CN); Fei Cai, Maanshan (CN); Qimin Wang, Maanshan (CN); Lin Zhang, Maanshan (CN); Biao Wang, Maanshan (CN); Lu Wang, Maanshan (CN); Ying Gao, Maanshan (CN); Wei Fang, Maanshan (CN); Jiagang Liang, Maanshan (CN)

(73) Assignees: ANHUI DUOJINTUCENG TECHNOLOGY CO. LTD., Maanshan (CN); ANHUI HUALING AUTOMOBILE CO., LTD., Maanshan (CN); ANHUI UNIVERISTY OF TECHNOLOGY, Maanshan (CN)

( * ) Notice: Subject to any disclaimer, the term of this patent is extended or adjusted under 35 U.S.C. 154(b) by 0 days.

(21) Appl. No.: 16/642,031

(22) PCT Filed: Dec. 24, 2018

(86) PCT No.: PCT/CN2018/122991
§ 371 (c)(1),
(2) Date: Feb. 26, 2020

(87) PCT Pub. No.: WO2019/128904
PCT Pub. Date: Jul. 4, 2019

(65) Prior Publication Data
US 2020/0239996 A1    Jul. 30, 2020

(30) Foreign Application Priority Data

Dec. 29, 2017 (CN) .......... 201711479893.2
Dec. 29, 2017 (CN) .......... 201711483447.9

(51) Int. Cl.
*C23C 14/00* (2006.01)
*C23C 14/02* (2006.01)
(Continued)

(52) U.S. Cl.
CPC ........ *C23C 14/0021* (2013.01); *C23C 14/022* (2013.01); *C23C 14/0652* (2013.01); *C23C 14/24* (2013.01)

(58) Field of Classification Search
CPC . C23C 14/0021; C23C 14/022; C23C 14/027; C23C 14/0652; C23C 14/24;
(Continued)

(56) References Cited

U.S. PATENT DOCUMENTS 10,786,851 B2 * 9/2020 Katagiri ............. C23C 14/0021
2018/0223436 A1 * 8/2018 Schier ................. C23C 14/0641

FOREIGN PATENT DOCUMENTS

CN     102400099 A    4/2012
CN     102817032 A    12/2012
(Continued)

OTHER PUBLICATIONS

Weiwei Wu, et al., Design of AlCrSiN multilayers and nanocomposite coating for HSS cutting tools, Applied Surface Science 351, 2015, pp. 803-810.
(Continued)

*Primary Examiner* — Jaehwan Oh
(74) *Attorney, Agent, or Firm* — Bayramoglu Law Offices LLC

(57) ABSTRACT

An ion source enhanced AlCrSiN coating for a cutting tool is provided. The ion source enhanced AlCrSiN coaling has
(Continued)

gradient Si content and grain size, including sequentially an AlCrSiN working layer, an interlayer and an AlCrN bottom layer in order from a surface of the coating to a substrate, wherein from the AlCrN bottom layer to the AlCrSiN working layer, Si content in the interlayer is gradually increased, and the interlayer has a texture that changes from coarse columnar crystals to fine nanocrystals and amorphous body. A texture of the coating, in which the grain size is gradually decreased, sequentially includes coarse columnar crystals, fine columnar crystals and fine equiaxed crystals. A method for preparing the ion source enhanced AlCrSiN coating with the gradient Si content and grain size is provided as well as a cutting tool having the coating deposited thereon.

9 Claims, 19 Drawing Sheets

(51) Int. Cl.
    *C23C 14/06*     (2006.01)
    *C23C 14/24*     (2006.01)

(58) Field of Classification Search
    CPC ....... C23C 14/325; C23C 16/34; C23C 28/04; C23C 28/042; C23C 28/044; C23C 28/048; C23C 30/005
See application file for complete search history.

(56) References Cited

FOREIGN PATENT DOCUMENTS

| CN | 103978748 A | 8/2014 |
|---|---|---|
| CN | 104131250 A | 11/2014 |
| CN | 104441828 A | 3/2015 |
| CN | 104766980 A | 7/2015 |
| CN | 105568230 A | 5/2016 |
| CN | 106011762 A | 10/2016 |
| CN | 106480417 A | 3/2017 |
| CN | 107267916 A | 10/2017 |
| CN | 108118301 A | 6/2018 |
| CN | 108165925 A | 6/2018 |
| JP | S60174873 A | 9/1985 |
| WO | 2014196634 A1 | 12/2014 |

OTHER PUBLICATIONS

C. Tritremmel, et al., Influence of Al and Si content on structure and mechanical properties of arc evaporated Al—Cr—Si—N thin films, Thin Solid Films 534, 2013, pp. 403-409.

* cited by examiner

ION SOURCE ENHANCED ALCRSIN COATING WITH GRADIENT SI CONTENT AND GRADIENT GRAIN SIZE

CROSS REFERENCE TO THE RELATED APPLICATIONS

This application is the national phase entry of International Application No. PCT/CN2018/122991, filed on Dec. 24, 2018, which is based upon and claims priority to Chinese Patent Applications No. 20171147989.3.2 and No. 201711483447.9, both filed on Dec. 29, 2017, the entire contents of which are incorporated herein by reference.

TECHNICAL FIELD

The present invention relates to a method for modifying a cutting tool coated with a AlCrSiN composite gradient multilayer coating, in particular to an ion source enhanced AlCrSiN coating with a gradient Si content and a gradient grain size.

BACKGROUND

With the development of science and technology, the machining industry expects more sophisticated and effective cutting tools. Efficient, composite and environmentally friendly manufacturing concepts have received widespread attention. Hard coatings have been widely applied on cutting tools. At the same time, workpieces to be machined and environmental issues raise higher requirements for cutting process, such as requiring increased cutting speed, improved workpiece surface quality and less, or zero use of cutting fluid during the cutting process. Improvements in cutting speed have been achieved by the emergence of coated cutting tools. Such coated tools combine a substrate having high strength and good toughness with a highly wear-resistant hard film surface layer. These advancements have moved machining technology forward significantly and have played an important role in improving the cutting performance of the cutting tools. Machining accuracy and efficiency, prolonged service life, improved surface quality of machined workpieces and a reduction in production costs all have been realized by the aforementioned coating technologies.

Hard coatings have been applied to cutting tools with increased frequency. Statistics show that surfaces of ore than 85% of cemented carbide cutting tools have been subjected to coating treatment, and the proportion will continue to increase in the next few years. Coating materials for the cutting tools have experienced the development from the first-generation simple binary coatings (TiN and TiC), the second-generation ternary or quaternary solid solution coatings (TiAlN, (TiCN, TiAlCN, etc.), the third-generation multilayer or superlattice coatings (TiN/TiC/TiN multilayer, TiN/TiAlN/TiN multilayer, TiN/AlN superlattice, etc.) to the fourth-generation nanocomposite coatings (TiSiN, TiAlSiN, etc.). Among them, the fourth-generation nanocomposite coating is a composite coating in which nc-TiN or nc-AlTiN is embedded in a very thin amorphous substrate a-$Si_3N_4$. Such coating has ultra-high hardness (>40 GPa), high toughness, excellent high-temperature stability and hot hardness (>1000° C.), and high oxidation resistance, which makes it adequate to the demands of high hardness, high toughness, high wear-resistance and high temperature performance of the coating for the cutting tool required for high speed machining of difficult-to-machine materials.

During the cutting process, the coated cutting tools experience forces and thermal loads. These loading variables are displaced on the working tool concurrently as well as alternatingly. In addition to the higher hardness and oxidation resistance, therefore, the coating for the cutting tool needs to have sufficient toughness and adhesion strength to resist peeling of the coating during the cutting process. Studies have shown that the differences in hardness and coefficient of thermal expansion between the substrate and the coating may be reduced by adding a transition layer between the substrate and the coating to increase its adhesion strength. Additionally, the substrate can be subjected to surface modification treatments, such as activation, high-energy ion etching and cleaning, and shot peening to improve the adhesion strength and performance between the coating and the substrate. Ultrasonic nanocrystalline surface modification (UNSM) performed on the surface of high-speed steel substrate can significantly improve the frictional property of AlCrN coatings. For example, $Ar^+$ bombardment performed on the surface of coating can enhance the surface activity, thereby improving the high speed cutting performance of the coated cutting tools. As another example, (Ti:N)-DLC nano-multilayer composite coatings have been successfully prepared by ion source assisted cathodic arc ion-plating technology. The $Ar^+$ etching technology can effectively clean contaminants on the surface of the substrate and roughen the surface of the substrate to produce microscopic irregularities, thereby enhancing the adhesion between the coating and the substrate.

At present, the pretreatment for coatings of the cutting tools mainly includes etching the substrate directly with metal Ti or Cr ions under the condition of high negative bias voltage (−800 V to −1200 V) for the substrate, or cleaning the substrate using $Ar^+$ together with metal ions under the condition of introducing Ar gas. This kind of cleaning has disadvantages, however, such as metal droplets easily formed by the metal ions on the surface of the substrate of the cutting tools, or the need of higher negative bias voltage (−800 V to −1200 V) for cleaning, which demands increased power thus proportionally increasing cost.

Multi-arc ion plating technology is the mainstream technology for the preparation of the coatings for the cutting tools at the current stage. This technology has advantages such as having high ionization rate and being suitable for large-scale industrial production. In addition, under the acceleration by negative bias voltage, the deposited film has good adhesion strength, dense texture and high deposition rate. It currently has been widely used in hard wear-resistant coatings and high-temperature protective coatings for cutting tools. Previous reports mainly focused on improving the cutting performance of the coatings for cutting tools by adjusting and designing the working layer in direct contact with the material being cut. A method for improving gradient AlCrSiN coatings for cutting tools using an interlayer with gradient Si content, gradient texture and gradient grain size after high-energy ion source etching pretreatment on the substrate has not yet been discovered.

SUMMARY

An objective of the present invention is to overcome the shortcomings of the prior art and provide an ion source enhanced AlCrSiN coating with a gradient Si content and a gradient grain size, wherein by ion source etching and cleaning technology and the addition of gradient transition interlayer, the service life of the coating for cutting tools is improved.

The present invention is achieved by the following technical solutions. The present invention provides an ion source enhanced AlCrSiN coating with a gradient Si content and a gradient grain size, comprising sequentially an AlCrSiN working layer, an interlayer and an AlCrN bottom layer in order from a surface of the coating to a substrate, wherein from the AlCrN bottom layer to the AlCrSiN working layer, Si content in the interlayer is gradually increased, and the interlayer has a texture that changes from coarse columnar crystals to fine nanocrystals and amorphous body, the texture sequentially includes coarse columnar crystals, fine columnar crystals and fine equiaxed crystals, the grain size of the interlayer is gradually decreased.

In a preferred embodiment of the present invention, the Si content is gradually increased from 1 wt. % to 5 wt. %, and the grain size is gradually decreased from 60 nm to 20 nm.

Cr in the AlCrSiN coating is completely or partially replaced by Ti to obtain an AlTiSiN coating or an AlCrTiSiN coating.

The substrate is subjected to etching and cleaning in advance, which includes the steps of:

evacuating a vacuum oven for multi-arc ion plating to $2.0 \times 10^{-4}$ Pa, and then introducing Ar gas to adjust the pressure to 4.0 Pa and heating to 450° C., turning on a cleaning Ti target, and then turning on an anode target, so as to form positive and negative electrodes with the cleaning Ti target to achieve traction of electron motion, allowing the electrons to collide with the Ar gas to generate $Ar^+$, and then controlling a negative bias voltage to −200 V, thereby attracting the $Ar^+$ to perform ion bombardment on the surface of the substrate for the bombardment time of 45 min.

In a preferred embodiment of the present invention, the AlCrSiN coating has a coefficient of friction of 0.36-0.40 at room temperature.

In a preferred embodiment of the present invention, the AlCrSiN coating has a microhardness greater than 3800 HK.

A method for preparing the ion source enhanced AlCrSiN coating with the gradient Si content and the gradient grain size, including the steps of (1) evacuating a vacuum oven to a background vacuum of $1 \times 10^{-4}$ to $2 \times^{-4}$ Pa, and raising a temperature to 480° C.;

(2) introducing Ar gas, controlling the vacuum degree in the vacuum oven to 4.0 Pa and reducing a negative bias voltage for a substrate to −200 V, and then turning on a Ti target and controlling a target current to 80 A, followed by performing etching and cleaning on the surface of the substrate by a high-energy ion bombardment at the negative bias voltage for the substrate of −200 V for the cleaning time of 45 min;

(3) turning off the Ti target and introducing nitrogen gas, controlling the negative bias voltage for the substrate to −60 V and adjusting the vacuum degree in the vacuum oven to 3.5 Pa, the nitrogen gas being introduced in such way to maintain a constant pressure at the vacuum degree of 3.5 Pa using two sets of AlCr targets, and adjusting current of the two sets of AlCr targets to 120 A for a period of 77 min;

(4) continuously operating the two sets of AlCr targets with the preset parameters, and adjusting a target current of an AlCrSi target to 120 A with the negative bias voltage for the substrate still being −60 V for a period of 58 min;

(5) turning off one set of the AlCr targets, and continuously operating the remaining AlCr targets and the AlCrSi target with the preset parameters for a period of 88 min.; and (6) turning off the AlCr targets, and continuously operating the AlCrSi target with the preset parameters for a period of 120 min.

In a preferred embodiment of the present invention, the Ar gas has a purity of 99.999%.

In a preferred embodiment of the present invention, she nitrogen gas has a purity of 99.999%.

In a preferred embodiment of the present invention, the AlCr target has an atomic ratio of Al to Cr of 70:30.

In a preferred embodiment of the present invention, the AlCrSi target has an atomic ratio of Al:Cr:Si of 60:30:10.

The coating prepared according to the present invention is applied to a cutting tool.

Conventional cleaning of the substrate is carried out by using Ar ions and metal Cr or Ti ions together at a bias voltage up to −800 V to −1200 V, while the present invention has advantages, including a low negative bias voltage (−200 V) requirement, and the use of the Ti target is needed only for excitation to generate Ar ions and is not used for cleaning.

The ordinary AlCrSiN coating has a relatively high internal stress and a relatively significant difference in coefficient of thermal expansion, due to a significant difference in lattice parameters between the ordinary AlCrSiN coating and the substrate of the cutting tool. In the present invention, a uniform multi-arc ion plating technology is used to prepare the gradient AlCrSiN multilayer coating, thereby gradually increasing the Si content in the interlayer. The Si content has a major effect on the coating in terms of refinement of grain and texture. Specifically, the higher the Si content, the smaller the grain size and the finer the texture. Therefore, as the Si content increases, the refining effect is enhanced, the grain size becomes smaller, and the texture becomes finer. The texture is gradually changed from coarse columnar crystals to fine equiaxed crystals incrementally, and the grain size is gradually decreased from 60 nm to 20 nm, which can effectively reduce the internal stress of the coating and the difference in coefficient of thermal expansion between the coating and the substrate, thereby improving the coating's resistance to impact during the cutting process.

The present invention has advantages over the prior art in that according to the present invention, at a low negative bias voltage, the substrate is subjected to etching and cleaning by only using high-energy Ar ions with adjusting different currents for the cleaning to improve the cutting performance of the coated cutting tool and remove attached substances from the surface, thereby reducing defects and roughness on the surface of the coating, and improving adhesion strength and cutting life of the coating. The coating prepared by the present invention has advantages such as optimal process reproducibility, ease in realizing industrial production improvements, mild compositional and structural changes, low coefficient of friction, reduced internal stress, toughness, excellent high-temperature stability and a reduction in the difference in coefficients of thermal expansion. The cutting tools with the deposited coating are especially suitable for cutting high-hardness steel materials at high speeds. Tests using the cutting tools produced by the present invention showed that the coated cutting tools have a cutting life increased by 2 times or more, and greatly improved mechanical wear resistance and high-temperature oxidation resistance, which can meet the requirements of high-speed machining on materials of the cutting tools, and will have favorable market potential and use value.

DETAILED DESCRIPTION OF THE EMBODIMENTS

Hereinafter, embodiments of the present invention will be described in detail. The embodiments are implemented based on the technical solutions of the present invention and the detailed implementations and specific operating procedures are provided. However, the protection scope of the present invention is not limited by the following embodiments.

Embodiment 1

Figure 1:
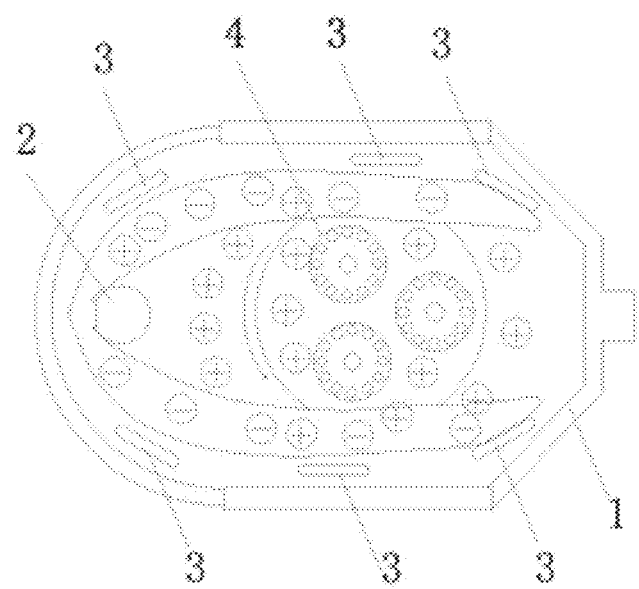
FIG. 1 is a schematic diagram of the ion cleaning of the present invention.

As shown in FIG. 1, the cylindrical Ti target 2 for high-energy ion cleaning and six targets 3 for coating deposition were distributed in the chamber 1 of a vacuum oven in this embodiment. When the vacuum oven reached a high vacuum, the cylindrical Ti target 2 was turned on for ionization to obtain a large amount of Ti ions, and at the same time, argon gas was introduced to excite Ar+ to etch and clean a substrate. In FIG. 1, 4 represents a workpiece.

A pre-treated high-speed steel cutting tool was evenly fixed on a rotating stand in the chamber, and the rotation speed of the rotating stand was controlled to 3 rpm. After that, the chamber was evacuated to a background vacuum of $1 \times 10^{-4}$ to $2 \times 10^{-4}$ Pa, while turning on a heater to raise the temperature to 480° C.

When the vacuum degree in the vacuum oven reached $2.0 \times 10^{-4}$ Pa, Ar gas with a purity of 99.999% was introduced, followed by heating to 450° C. The cylindrical Ti target was turned on as a traction arc target. The current during cleaning was controlled to 40 A, so that a large number of electrons were excited. A circular auxiliary anode target was turned on to form a positive electrode and a negative electrode with the Ti target, thereby achieving traction of electron motion. The electrons collided with the Ar gas in the vacuum oven to generate high density of Ar+. Negative bias voltage for the substrate was set to −200 V, attracting the Ar+ to perform ion bombardment on the surface of the substrate for the bombardment time of 45 min.

After that, the cylindrical Ti arc target was turned off, and a $N_2$ flow valve was opened, followed by controlling the negative bias voltage for the substrate to −60 V and adjusting the vacuum degree in the vacuum oven to about 3.5 Pa. $N_2$ was introduced in such way to maintain a constant pressure. Two sets of AlCr targets were used and their currents were adjusted to 130 A for a period of 252 min.

Then, the AlCr targets were turned off, and the current of a set of AlCrSi targets was adjusted to 130 A, with the negative bias voltage for the substrate still being −60 V, for a period of 122 min. Finally, the AlCrSi targets were turned off, the bias voltage power supply was turned off and the $N_2$ flow valve was closed to complete the coating process. The cutting tool was cooled along with the vacuum oven to 25° C. and then removed.

The substrate which was subjected to the ion etching and cleaning, and the prepared coating were tested.

Embodiment 2

In the present embodiment, the current for cleaning of the Ti cylindrical arc was controlled to 70 A during the process of the high-energy Ar+ ion etching. The substrate which was subjected to the ion etching and cleaning, and the prepared coating were tested.

For other aspects, this embodiment was performed in the same manner as in Embodiment 1.

Embodiment 3

In the present embodiment, the current for cleaning of the Ti cylindrical arc was controlled to 100 A during the process of the high-energy Ar+ ion etching. The substrate which was subjected to the ion etching and cleaning, and the prepared coating were tested.

For other aspects, this embodiment was performed in the same manner as in Embodiment 1. The AlCrSiN coating prepared in this embodiment was denoted as AlCrSiN-1, and the coating included sequentially an AlCrSiN working layer and an AlCrN bottom layer in order from the surface of the coating to the substrate.

The detailed process parameters for the cleaning and deposition of the coating in each of the above embodiments are shown in Table 1.

TABLE 1

Detailed process parameters for cleaning and deposition of AlCrSiN coatings.

| step | substrate bias voltage (V) | gas flow (ml/min) | | target current (A) | | | substrate temperature (° C.) | deposition time (min) |
| --- | --- | --- | --- | --- | --- | --- | --- | --- |
| | | Ar | N$_2$ | Ti | AlCr | AlCrSi | | |
| 1 | −200 | 650 | 0 | 40 | 0 | 0 | 450 | — |
| | | | | 70 | | | | |
| | | | | 100 | | | | |
| 2 | −60 | 0 | 680 | 0 | 130 | 0 | 450 | 252 |
| 3 | −60 | 0 | 680 | 0 | 0 | 130 | 450 | 122 |

The sample of each embodiment, after being prepared, was subjected to relevant tests. The test results of the AlCrSiN coatings are shown in Table 2.

TABLE 2

Test results of AlCrSiN coatings.

| coating | $L_{c2}$ (N) | HF | surface roughness | |
| --- | --- | --- | --- | --- |
| | | | $R_a$ | $S_q$ |
| I$_{40}$ | 41 | HF3 | 140 | 226 |
| I$_{70}$ | 46 | HF2 | 88 | 140 |
| I$_{100}$ | 52 | HF1 | 69 | 117 |

In order to compare the three cleaned substrates and coatings in Embodiment 1, Embodiment 2 and Embodiment 3, the following tests were performed.

Figure 2A:
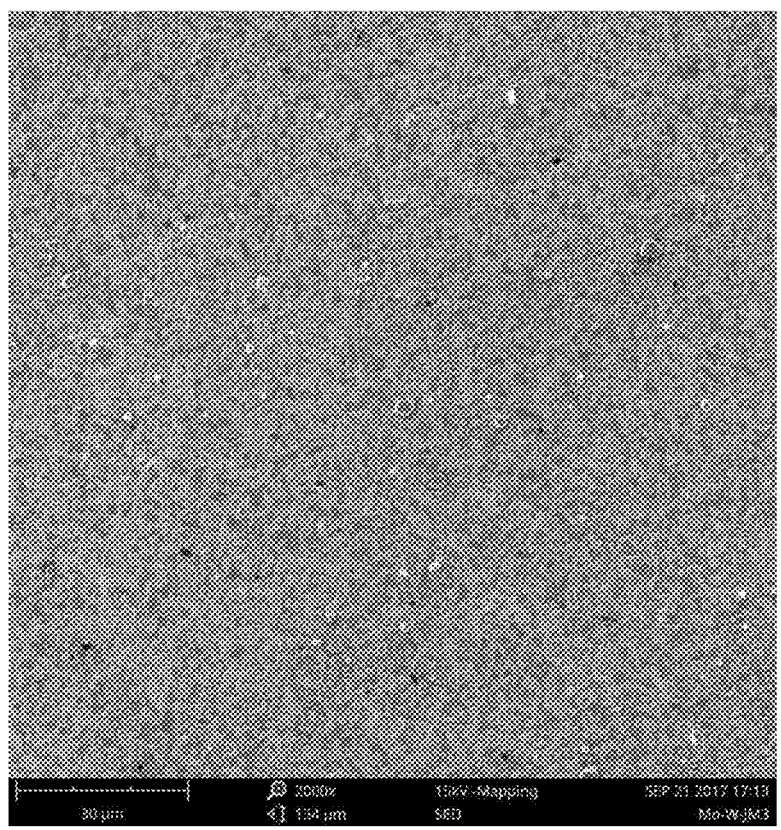
FIG. 2A shows the surface morphology of the substrate after Ar+ etching at the current for cleaning of 40 A.
Figure 2B:
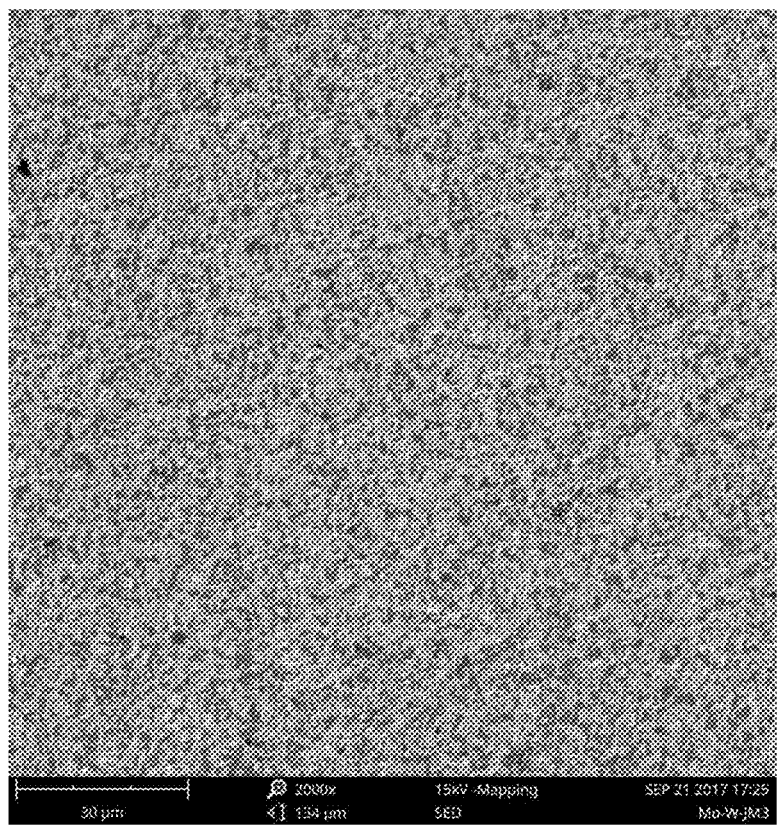
FIG. 2B shows the surface morphology of the substrate after Ar+ etching at the current for cleaning of 70 A.
Figure 2C:
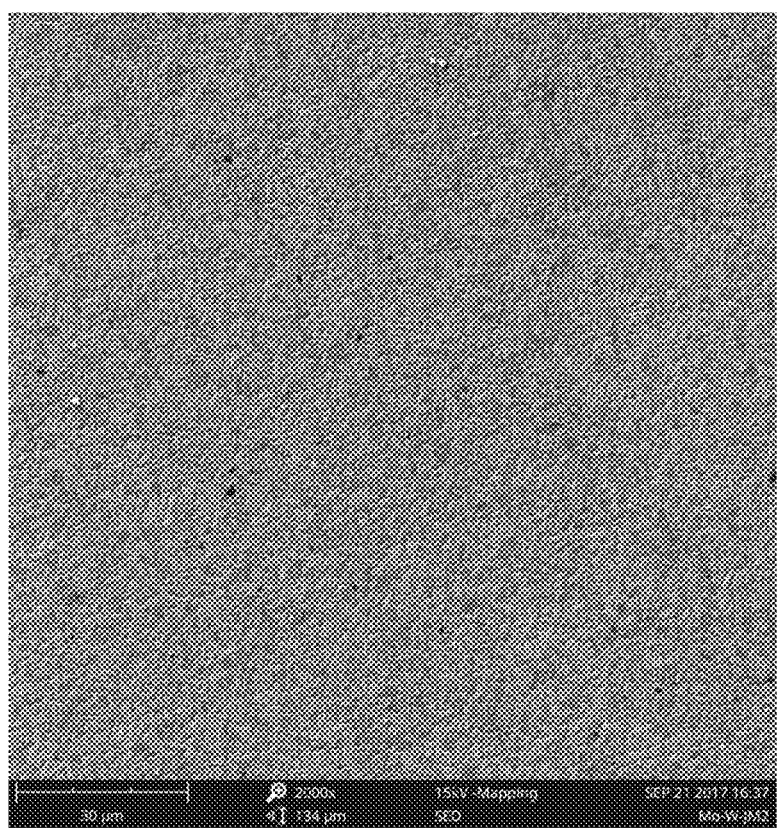
FIG. 2C shows the surface morphology of the substrate after Ar+ etching at the current for cleaning of 100 A.
Figure 2D:
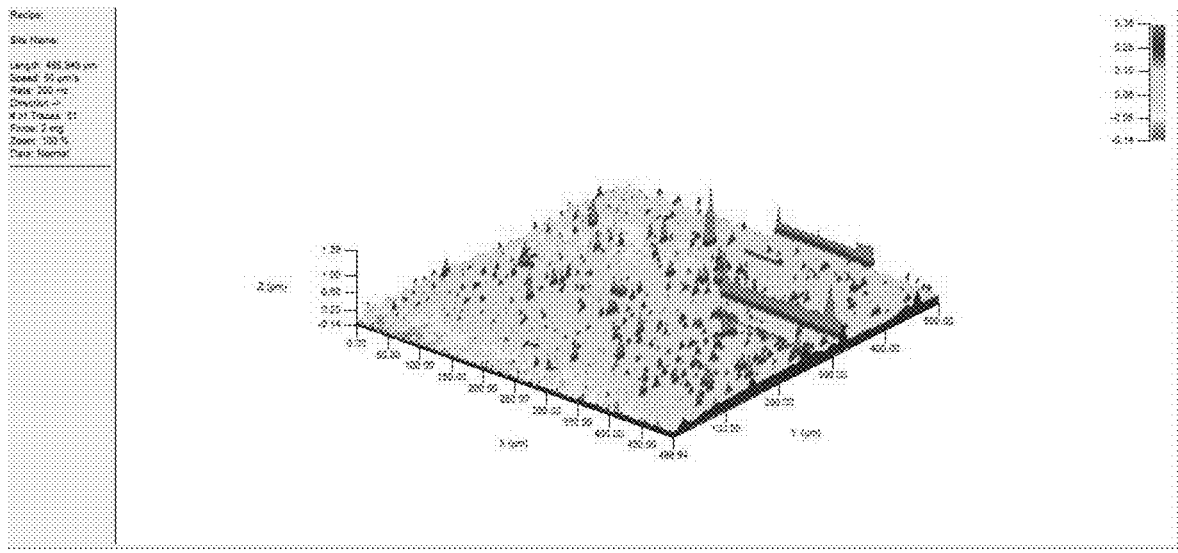
FIG. 2D shows the three-dimensional surface morphology of the substrate of FIG. 2A.
Figure 2E:
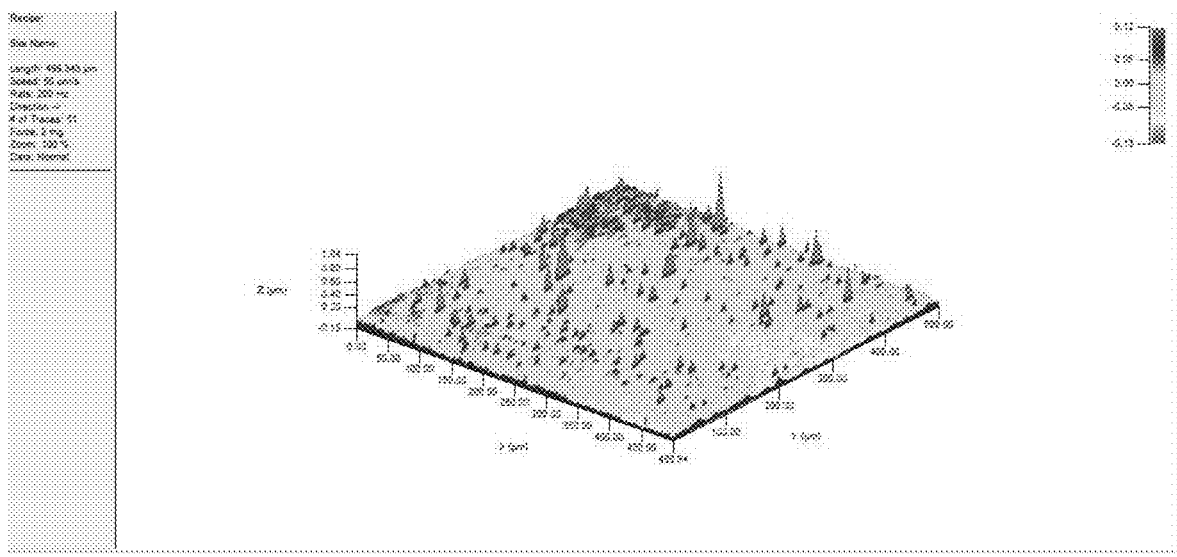
FIG. 2E shows the three-dimensional surface morphology of the substrate of FIG. 2B.
Figure 2F:
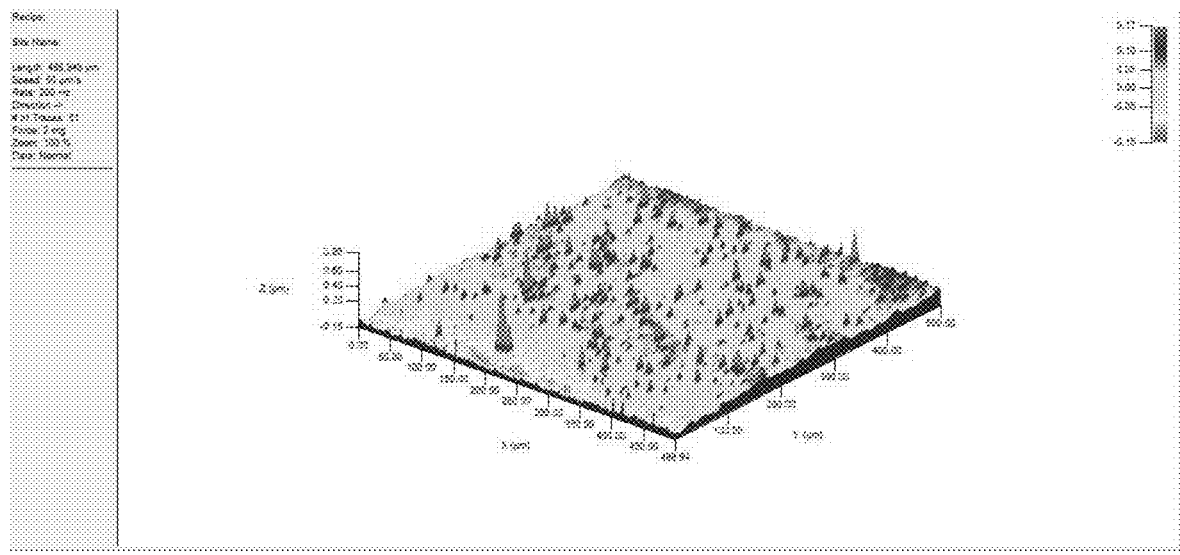
FIG. 2F shows the three-dimensional surface morphology of the substrate of FIG. 2C.

FIGS. 2A-2F show SEM images and three-dimensional morphologies of the surfaces of the substrates after Ar$^+$ etching treatment at different currents for cleaning. It can be found from FIG. 2A and FIG. 2D that when the current for cleaning was 40 A, there were still attached substances on the surface of the substrate after the Ar$^+$ etching treatment. When the current for cleaning was increased to 70 A, the attached substances on the surface of the substrate were reduced. By further increasing the current for cleaning to 100 A, almost no attached substances existed on the surface of the substrate, and traces of etching appeared on the surface of the substrate. It can be found that the surface of the substrate can be effectively etched and cleaned by increasing the current for cleaning. In the present invention, the surface roughness of the substrates which were subjected to the etching and cleaning was detected using a stylus profiler and characterized by root mean square height (Sq) and arithmetical mean deviation (Ra). FIGS. 2D-2F show three-dimensional morphologies of the surfaces of the substrates after ion etching treatment at different currents for cleaning. When the currents for cleaning were 40 A, 70 A, and 100 A, the surface roughnesses Sq of the coatings were 1112 nm, 759 nm, and 536 nm, respectively, and the Ra values of the coatings were 705 nm, 525 nm, and 396 nm, respectively. It can be found that when the current for cleaning is increased, the intensity of the Ar$^+$ etching is increased and the surface roughness of the substrate is significantly reduced.

Figure 3A:
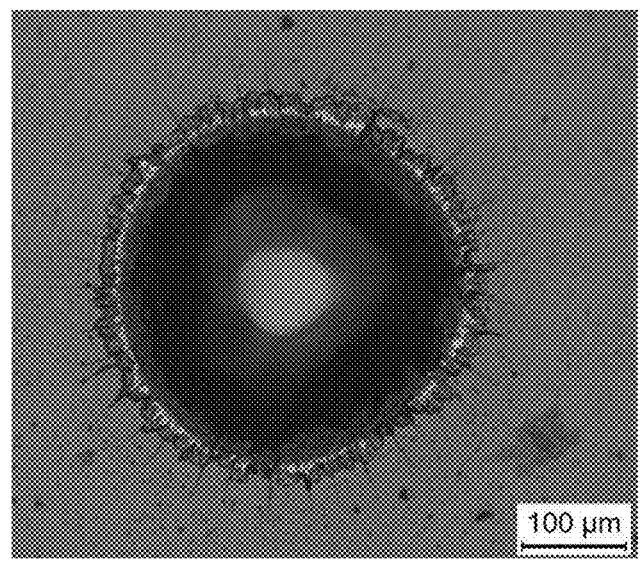
FIG. 3A shows the Rockwell indentation morphology of the AlCrSiN coatings deposited on the substrate after Ar+ etching at the current for cleaning of 40 A.
Figure 3B:
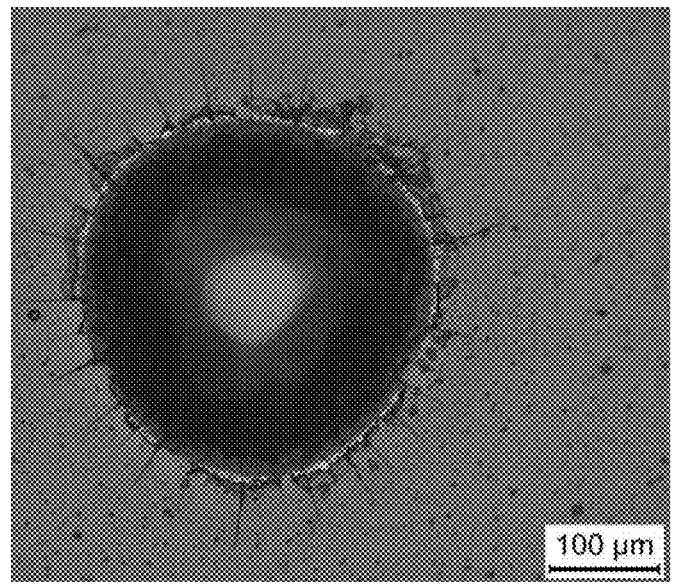
FIG. 3B shows the Rockwell indentation morphology of the AlCrSiN coatings deposited on the substrate after Ar+ etching at the current for cleaning of 70 A.
Figure 3C:
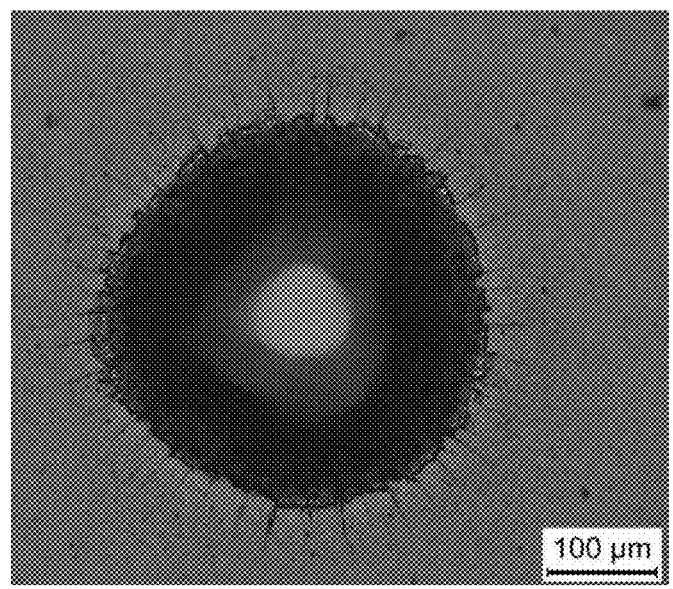
FIG. 3C shows the Rockwell indentation morphology of the AlCrSiN coatings deposited on the substrate after Ar+ etching at the current for cleaning of 100 A.

FIGS. 3A-3C show Rockwell indentation morphologies of the AlCrSiN coatings deposited on the substrates after Ar$^+$ etching at different currents for cleaning. FIG. 3A shows when the current for cleaning was 40 A, the cracks of the coating around the indentation were distributed radially and the coating was measurably exfoliated. When the current for cleaning was increased to 70 A, both the number of cracks and the exfoliation of the coating were greatly reduced, as shown in FIG. 3B. However, when the current for cleaning was increased to 100 A, there was almost no exfoliation of the coating. According to the standards of adhesion strength, it can be seen that when the currents for cleaning were 40 A, 70 A, and 100 A, the adhesion strengths between the AlCrSiN coatings and the substrates were graded as HF3, HF2 and HF1, respectively.

Figure 4:
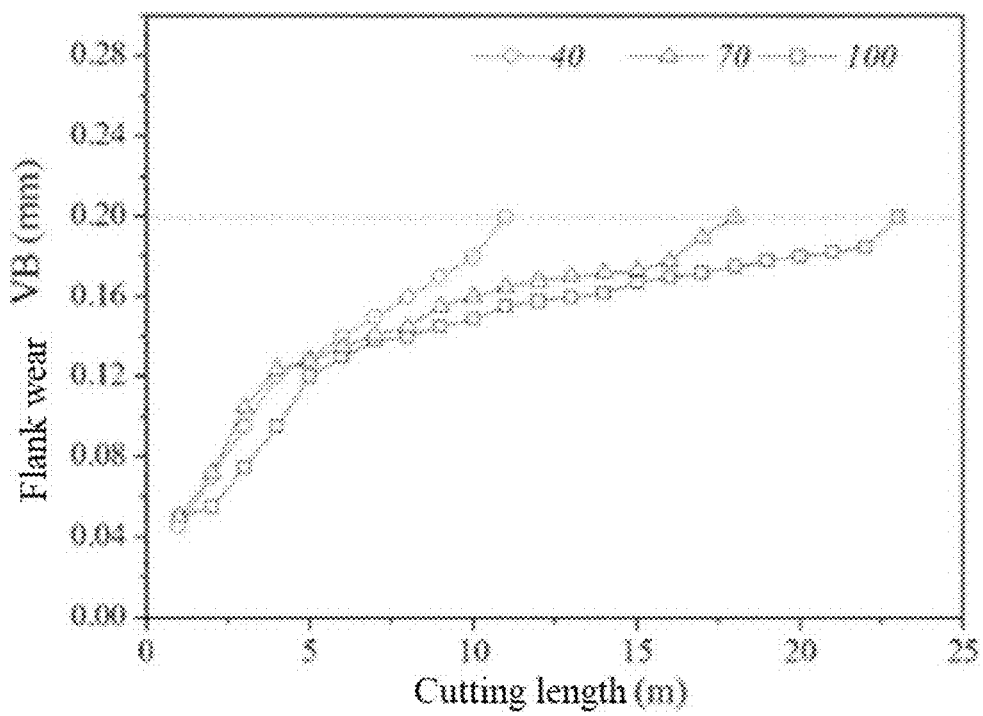
FIG. 4 shows cutting life curves of the AlCrSiN coatings deposited on the substrates after Ar+ etching under different currents for cleaning.

FIG. 4 shows cutting life curves of the coated cutting tools at a cutting speed of 50 m/min. When the wear at ½ of the flank surface of cutting tool reached the limit of wear (0.2 mm), it can be found that the Ar$^+$ cleaning process at different currents for cleaning has a significant impact on the service life of the cutting tool. In the case where the current for cleaning was 40 A, the cutting length was 11 m. When the current for cleaning was increased to 70 A, the cutting length of the cutting tool was increased to 18 m. However, when the current for cleaning was increased to 100 A, the cutting length of the cutting tool was further increased to 23 m, and its cutting life was increased to about 2 times or more of the cutting life when the current for cleaning was 40 A, which was mainly attributed to the good adhesion strength between the coating and the substrate. The results show that when the ion etching and cleaning process was performed at the current of 100 A under the low negative bias voltage, the coated cutting tool has the lowest surface roughness, the highest adhesion strength, and the longest cutting life. Therefore, before the coating is deposited, the high-energy Ar$^+$ etching and cleaning performed on the substrate of the cutting tool can significantly prolong its cutting life.

Embodiment 4

In the present embodiment, an AlCrSiN composite coating for cutting tools was specifically prepared by the following method.

A pre-treated high-speed steel cutting tool was evenly fixed on a rotating stand in the chamber, and the rotation speed of the rotating stand was controlled to 3 rpm. After that, the chamber was evacuated to a background vacuum of $1\times10^{-4}$ to $2\times^{-4}$ Pa, while turning on a heater to raise the temperature to 480° C.

When the vacuum degree in the vacuum oven reached $2.0\times10^{-4}$ Pa, Ar gas with a purity of 99.999% was introduced, followed by heating to 450° C. The cylindrical Ti target was turned on as a traction arc target. The current during cleaning was controlled to 100 A, so that a large number of electrons were excited. A circular auxiliary anode target was turned on to form a positive electrode and a negative electrode with the Ti target, thereby achieving traction of electron motion. The electrons collided with the Ar gas in the vacuum oven to generate Ar$^+$ having high density. Negative bias voltage for the substrate was set to −200 V, attracting the Ar$^+$ to perform ion bombardment on the surface of the substrate for a bombardment time of 45 min.

After that, the cylindrical Ti target was turned off, and a N$_2$ flow valve was opened, followed by controlling the negative bias voltage for the substrate to −6 V and adjusting the vacuum degree in the vacuum oven to about 3.5 Pa. N$_2$ was introduced in such way to maintain a constant pressure. Two sets of AlCr targets were used and their currents were adjusted to 130 A for a period of 77 min.

Then, the two sets of AlCr targets were continued to operate with the preset parameters, and the current of a set of AlCrSi targets was adjusted to 130 A, with the negative bias voltage for the substrate still being −60 V, for a period of 58 min.

Afterward, one set of the AlCr targets were turned off, and the remaining AlCr targets and the AlCrSi targets were continued to operate with the preset parameters for a period of 88 min.

Then, the AlCr targets were turned off, and the set of the AlCrSi targets were continued to operate with the preset parameters for a period of 120 min. Finally, the AlCrSi targets were turned off, the bias voltage power supply was turned off and the $N_2$ flow valve was closed to complete the coating process. The cutting tool was cooled along with the oven to 25° C. and removed.

Figure 5:
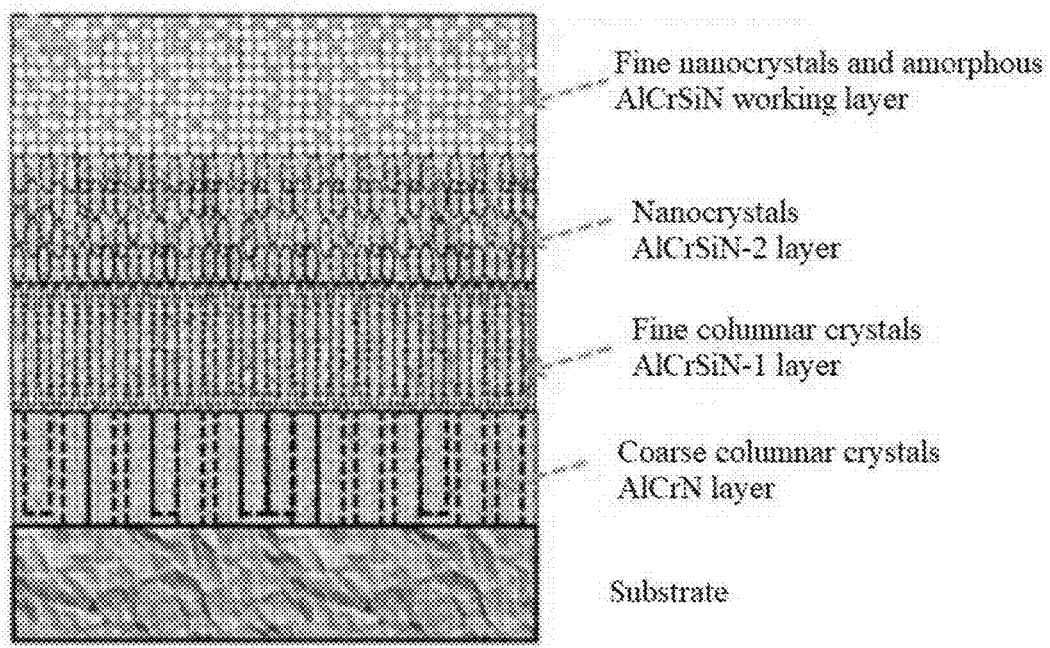
FIG. 5 shows a schematic structural diagram of the multilayer gradient AlCrSiN composite coating for cutting tools.
Figure 6:
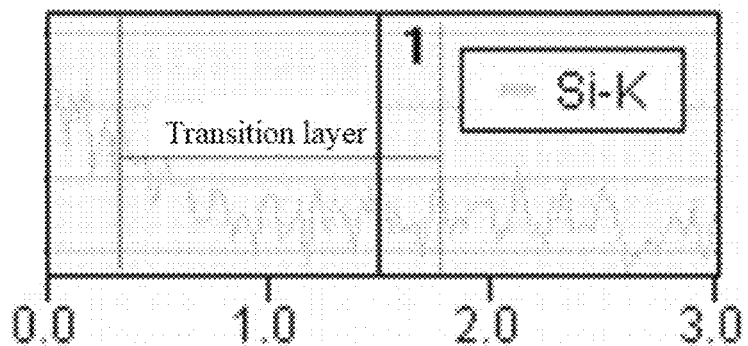
FIG. 6 is a diagram showing the distribution of the content of the Si element in the interlayer as the coating thickness changes.

As shown in FIG. 5, the AlCrSiN coating prepared in this embodiment having an interlayer with a gradient Si content was denoted as AlCrSiN-2. The coating sequentially included an AlCrSiN working layer, an interlayer and an AlCrN bottom layer in order from the surface of the coating to the substrate. From the AlCrN bottom layer to the AlCrSiN working layer, Si content in the interlayer was gradually increased from 1 wt. % to 5 wt. %, as shown in FIG. 6. The texture of the multilayer coating sequentially included coarse columnar crystals, fine columnar crystals and fine equiaxed crystals, in which the grain size was gradually changed from 60 nm to 40 nm and then to 20 nm, as shown in FIG. 7.

Figure 7:
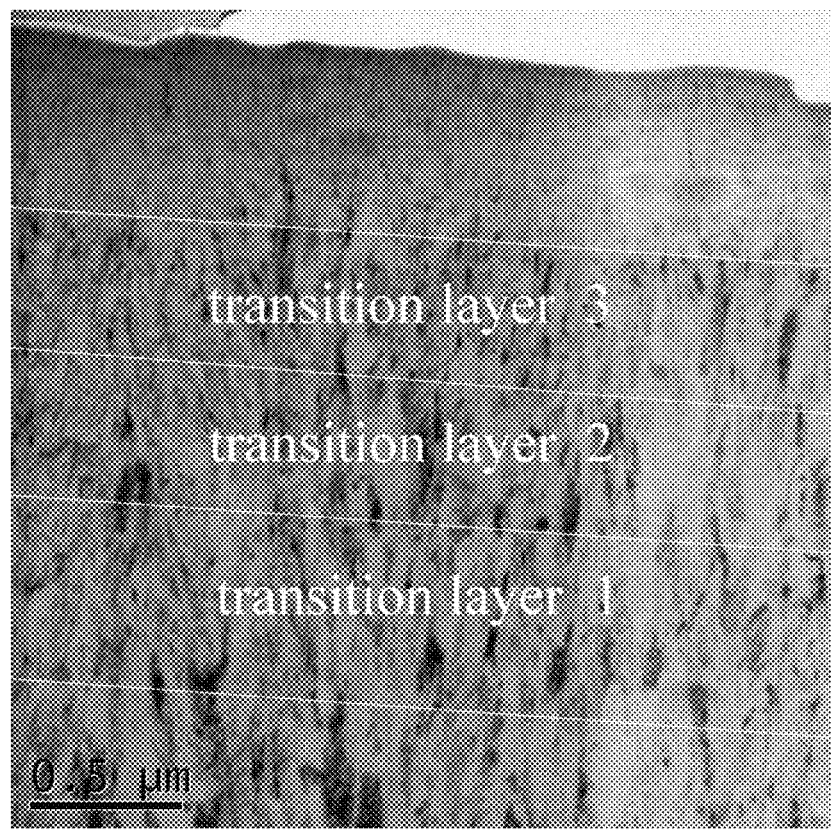
FIG. 7 shows a transmission electron microscopy (TEM) image of the interlayer.
Figure 8A:
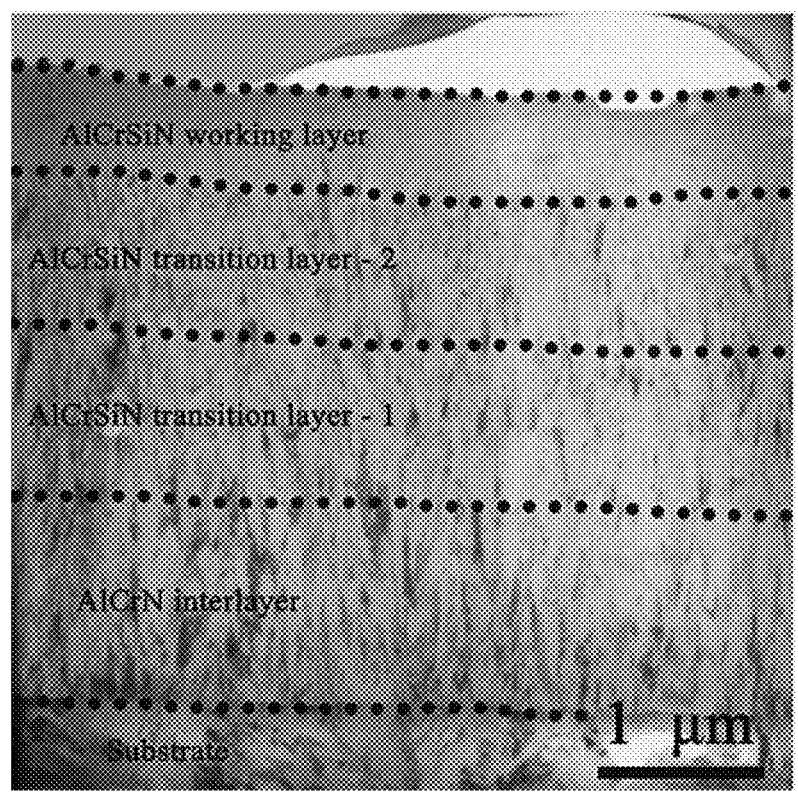
FIG. 8A shows the overall cross-sectional image of the AlCrSiN composite coating for the cutting tool.
Figure 8B:
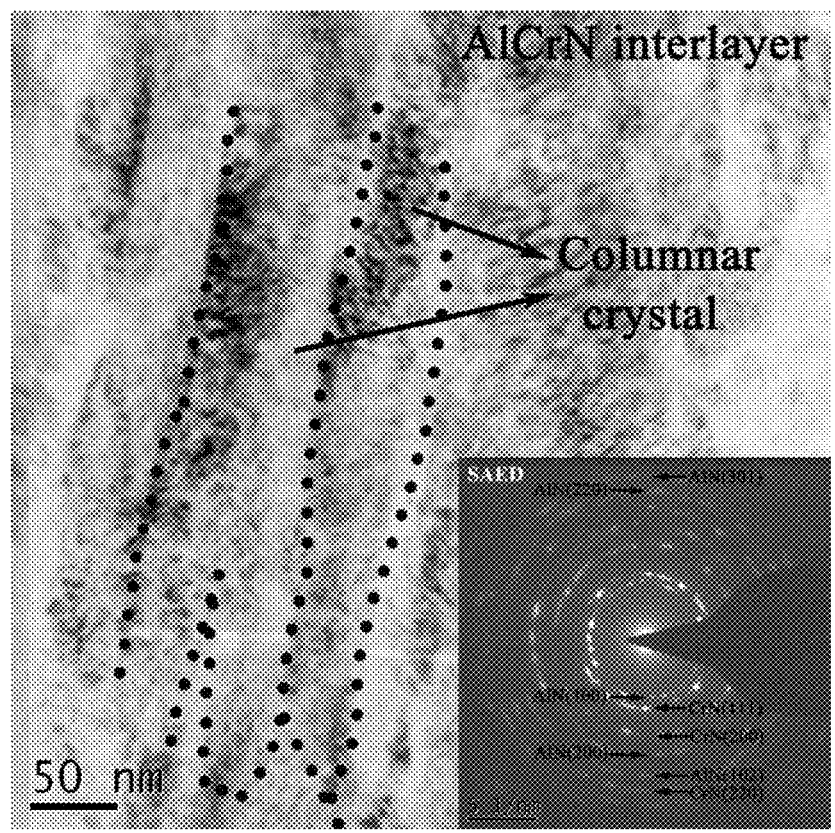
FIG. 8B shows the morphology and diffraction pattern of the AlCrN interlayer.
Figure 8C:
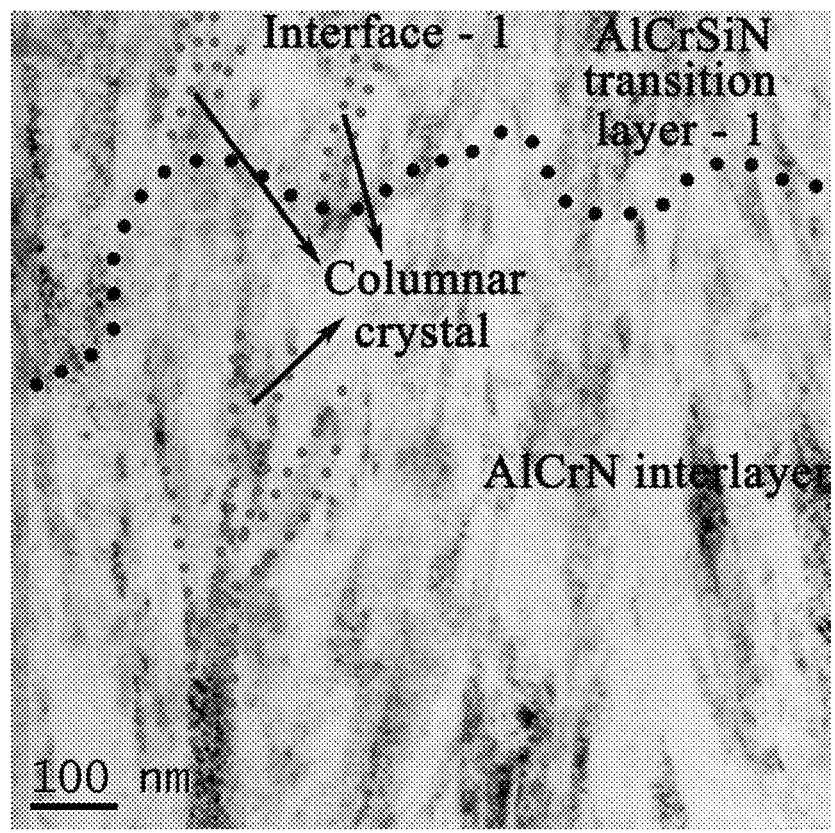
FIG. 8C shows the morphology of the interface between the interlayer and the transition layer 1.
Figure 8D:
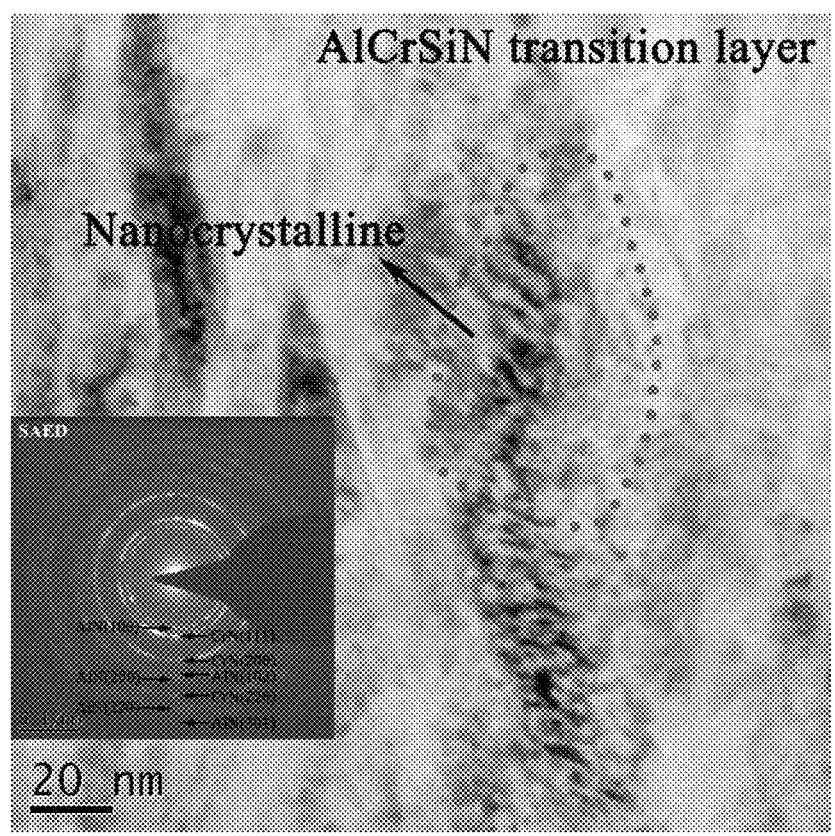
FIG. 8D shows the morphology and diffraction pattern of the transition layer 2.
Figure 8E:
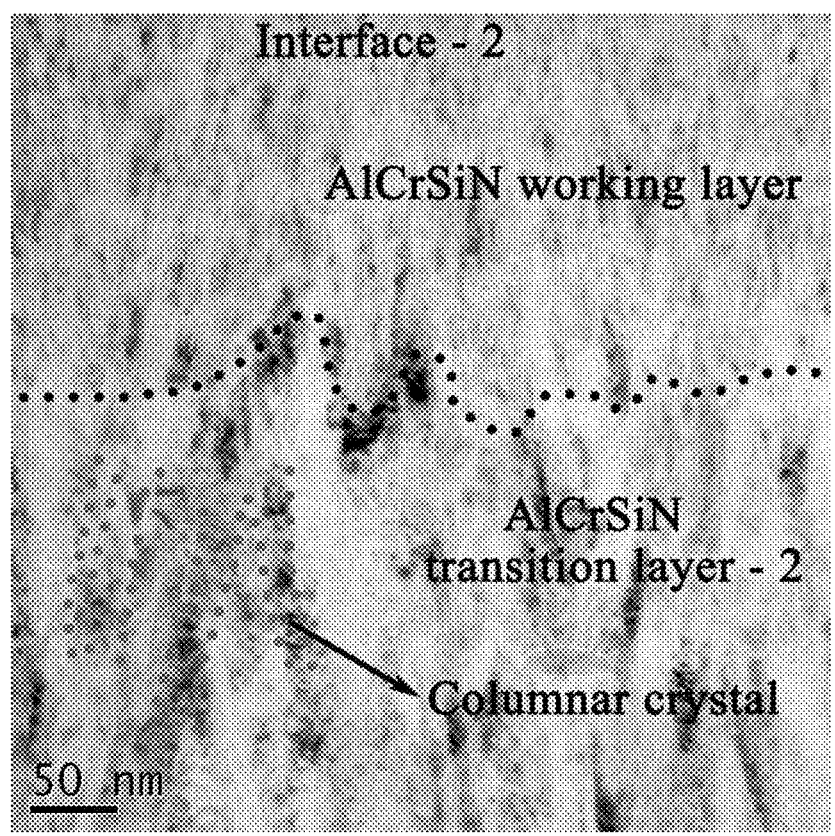
FIG. 8E shows the morphology of the interface between the transition layer 2 and the working layer.
Figure 8F:
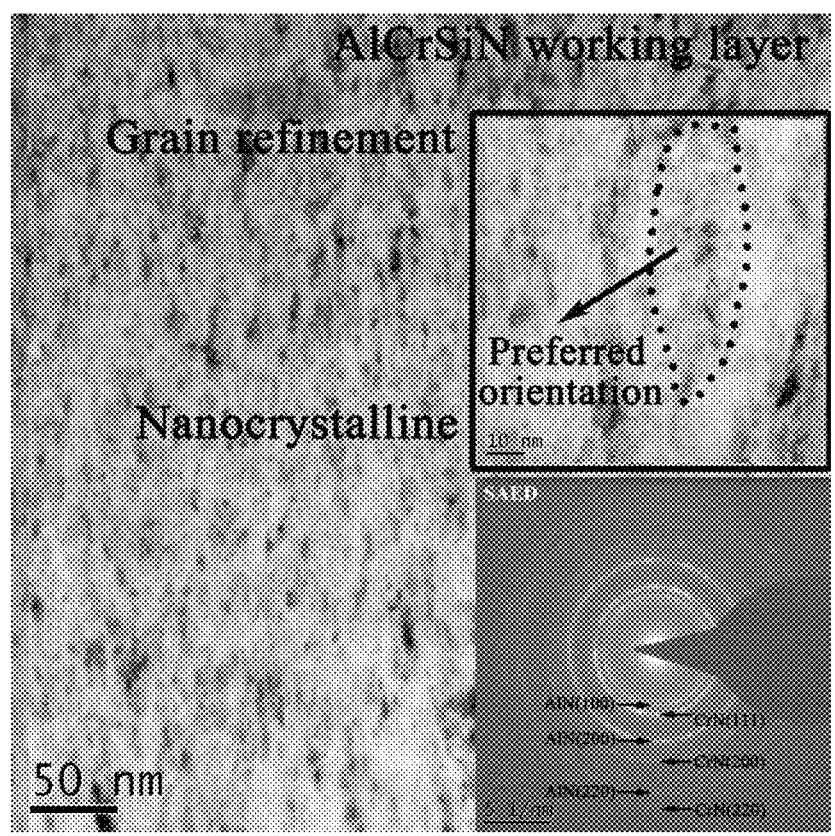
FIG. 8F shows the morphology and diffraction pattern of the working layer.
Figure 8G:
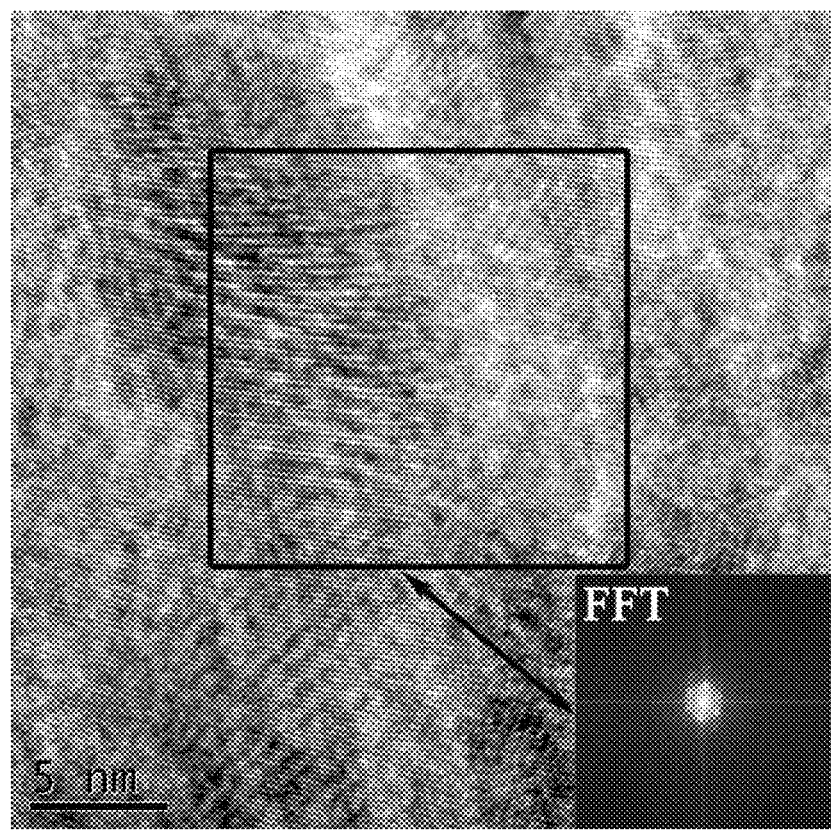
FIG. 8G shows the high-resolution morphology of the working layer.
Figure 8H:
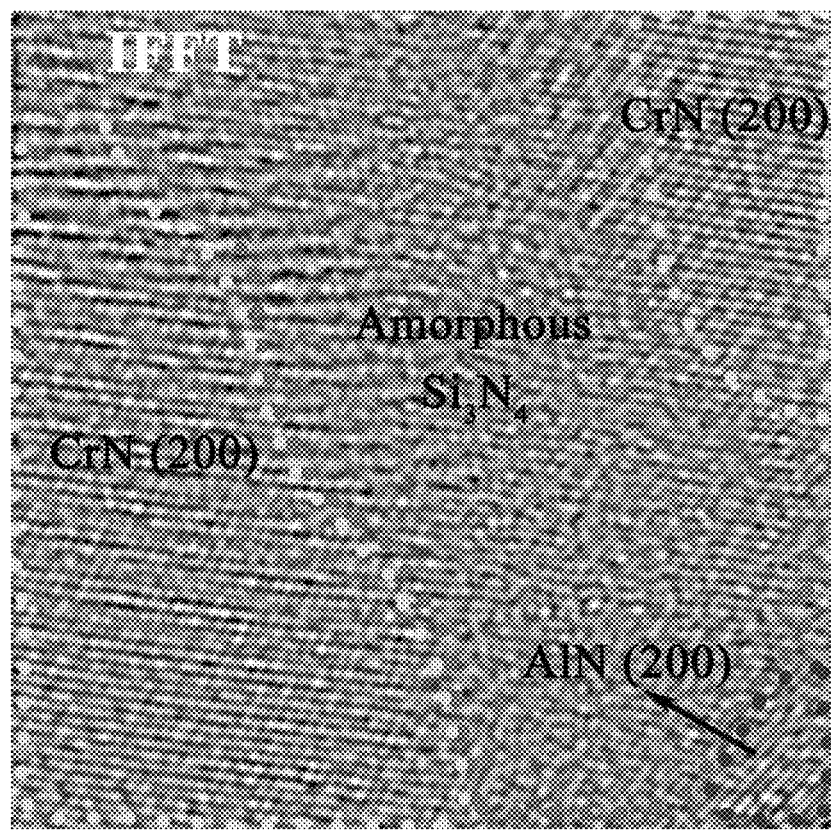
FIG. 8H shows the high-resolution morphology of the working layer after inverse Fourier transform.

FIG. 7 shows a TEM image of the interlayer with the gradient Si content prepared with the process parameters, including the transition layer 1, the transition layer 2, and the transition layer 3, of which the respective textures are coarse columnar crystals, fine columnar crystals and fine equiaxed crystals.

FIGS. 8A-8H show TEM images and diffraction patterns of the multiple layers of the AlCrSiN composite coating for the cutting tool. FIGS. 8A-8H show the overall cross-sectional image of the AlCrSiN composite coating for the cutting tool, the morphology and diffraction pattern of the AlCrN interlayer, the morphology of the interface between the interlayer and the transition layer 1, the morphology and diffraction pattern of the transition layer 2, the morphology of the interface between the transition layer 2 and the working layer, the morphology and diffraction pattern of the working layer, the high-resolution morphology of the working layer, and the high-resolution morphology of the working layer after inverse Fourier transform, respectively. The coating had a total thickness of about 5.0 μm. The texture of the multilayer coating sequentially included coarse columnar crystals, fine columnar crystals and fine equiaxed crystals, in which the grain size was gradually changed from 60 nm to 40 nm and then to 20 nm.

The coating had a surface microhardness of 3813.4 HK. The coating had a coefficient of friction of 0.36 to 0.4 in a ball-on-disc friction and wear test. The coatings were deposited on high-speed steel vertical milling cutters to perform cutting test for comparison under the following cutting conditions: wet cutting (water-based cutting fluid, the ratio of cutting fluid to water of 1:30); material to be cut: 20 CrMo (normalized, HB200); cutting speed: 94.2 m/min; feedrate: 600 mm/min; and axial and radial depth of cut: 2 mm. Even in such harsh environments, the service life of the coated cutting tool was increased by 2 times or more.

To compare the two coatings of Embodiment 3 and Embodiment 4, the following tests were performed.

Figure 9A:
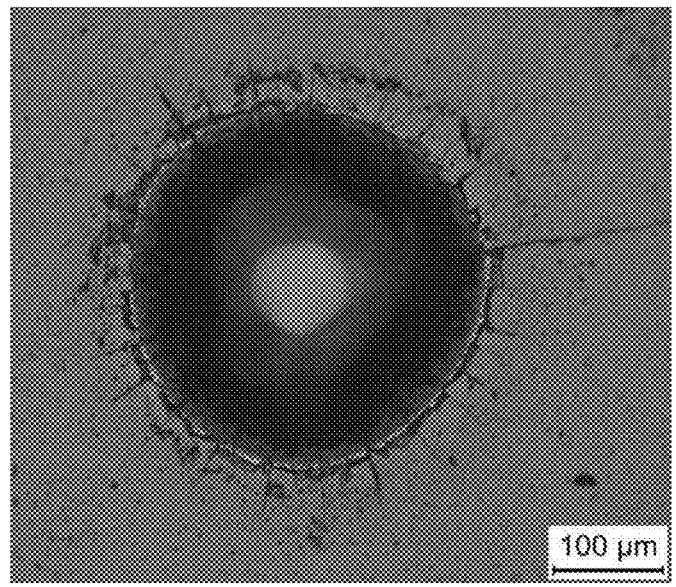
FIG. 9A shows the Rockwell indentation morphology of the coating AlCrSiN-1.
Figure 9B:
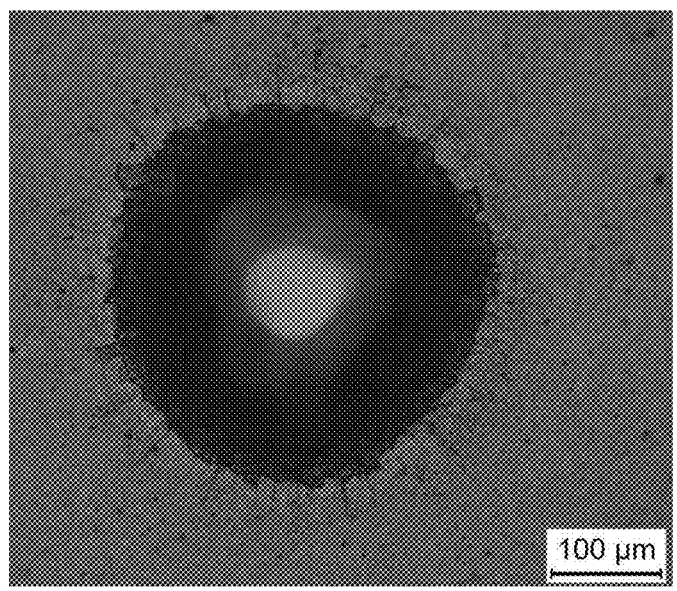
FIG. 9B shows the Rockwell indentation morphology of the coating AlCrSiN-2.

FIGS. 9A-9B show Rockwell indentation morphologies of the coatings prepared by the two processes, wherein FIG. 9A shows the AlCrSiN-1, and FIG. 9B shows the AlCrSiN-2. From FIG. 9A, it can be found that the cracks of the coating around the indentation were distributed radially and the coating was measurably exfoliated. It can be seen from FIG. 9B that after reinforced by the interlayer with the gradient Si content, the coating had almost no exfoliation. According to the standards of adhesion strength, it can be seen that the adhesion strengths between the two coatings and the substrates were graded as HF3 and HF1, respectively.

Figure 10:
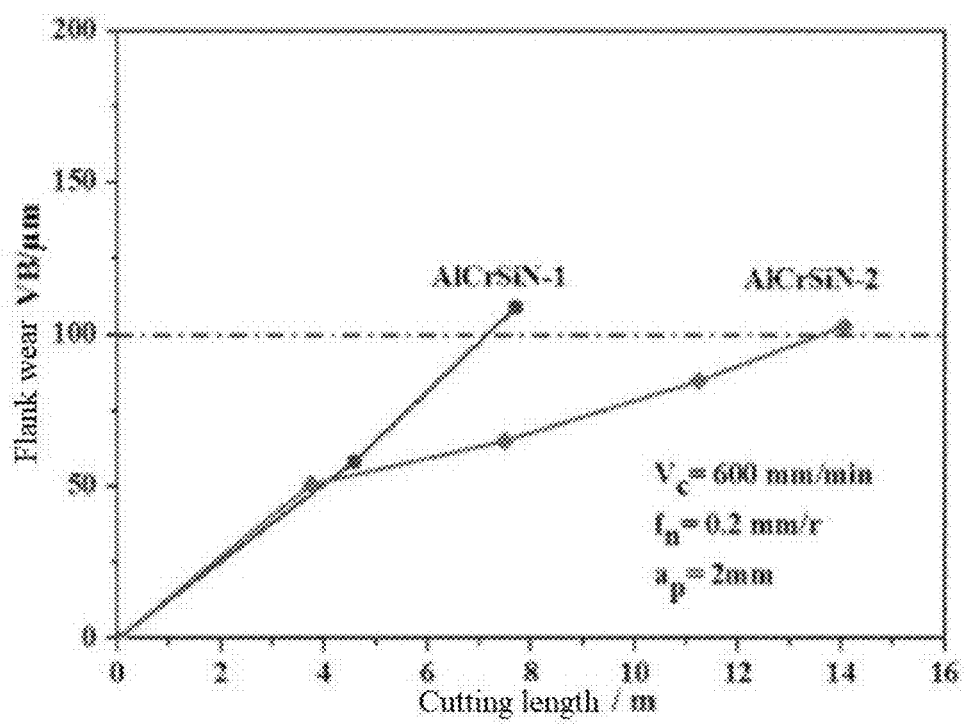
FIG. 10 shows cutting life curves of the high-speed steel cutting tools coated with the AlCrSiN composite coatings without and with interlayer reinforcement.

FIG. 10 shows cutting life curves under the same cutting conditions of the vertical milling cutters based on the high-speed steel substrates coated by the above two processes. In the case of specifying the flank wear, when the interlayer with the gradient Si content was used in the composite coating, the coating had an increased cutting life.

Embodiment 5

In this embodiment, an AlTiSiN coating, in which Cr in the AlCrSiN composite coating for cutting tools was completely replaced by Ti, was specifically prepared by the following method.

A pre-treated high-speed steel cutting tool was evenly fixed on a rotating stand in the chamber, and the rotation speed of the rotating stand was controlled to 3 rpm. After that, the chamber was evacuated to a background vacuum of $1\times10^{-4}$ to $2\times10^{-4}$ Pa, while turning on a heater to raise the temperature to 480° C.

When the vacuum degree in the vacuum oven reached $2.0\times10^{-4}$ Pa, Ar gas with a purity of 99.999% was introduced, followed by heating to 450° C. The cylindrical Ti target was turned on as a traction arc target. The current during cleaning was controlled to 100 A, so that a large number of electrons were excited. A circular auxiliary anode target was turned on to form a positive electrode and a negative electrode with the Ti target, thereby achieving traction of electron motion. The electrons collided with the Ar gas in the vacuum oven to generate $Ar^+$ having high density. Negative bias voltage for the substrate was set to −200 V, attracting the $Ar^+$ to perform ion bombardment on the surface of the substrate for a bombardment time of 45 min.

After that, the cylindrical Ti target was turned off, and a $N_2$ flow valve was opened, followed by controlling the negative bias voltage for the substrate to −60 V and adjusting the vacuum degree in the vacuum oven to about 3.5 Pa. $N_2$ was introduced in such way to maintain a constant pressure. Two sets of AlTi targets (Al:Ti=67:33) were used and their currents were adjusted to 120 A for a period of 75 min.

Then, the two sets of AlTi targets were continued to operate with the preset parameters, and the current of a set of AlTiSi targets (Al:Ti:Si=60:30:10) was adjusted to 120 A, with the negative bias voltage for the substrate still being −60 V, for a period of 55 min.

Afterward, one set of the AlTi targets were turned off, and the remaining AlTi targets and the AlTiSi targets were continued to operate with the preset parameters for a period of 85 min.

Then, the AlTi targets were turned off, and the set of the AlTiSi targets were continued to operate with the preset parameters for a period of 120 min. Finally, the AlTiSi targets were turned off, the bias voltage power supply was turned off and the $N_2$ flow valve was closed to complete the coating process. The cutting tool was cooled along with the oven to 25° C. and then removed.

Embodiment 6

In this embodiment, an AlCrTiSiN coating, in which Cr in the AlCrSiN composite coating for cutting tools was partially replaced by Ti, was specifically prepared by the following method.

A pre-treated high-speed steel cutting tool was evenly fixed on a rotating stand in the chamber, and the rotation speed of the rotating stand was controlled to 3 rpm. After that, the chamber was evacuated to a background vacuum of $1 \times 10^{-4}$ to $2 \times 10^{-4}$ Pa, while turning on a heater to raise the temperature to 480° C.

When the vacuum degree in the vacuum oven reached $2.0 \times 10^{-4}$ Pa, Ar gas with a purity of 99.999% was introduced, followed by heating to 450° C. The cylindrical Ti target us turned on as a traction arc target. The current during cleaning was controlled to 100 A, so that a large number of electrons were excited. A circular auxiliary anode target was turned on to form a positive electrode and a negative electrode with the Ti target, thereby achieving traction of electron motion. The electrons collided with the Ar gas in the vacuum oven to generate $Ar^+$ having high density. Negative bias voltage for the substrate was set to −200 V, attracting the $Ar^+$ to perform ion bombardment on the surface of the substrate for a bombardment time of 45 min.

After that, the cylindrical Ti target was turned off, and a $N_2$ flow valve was opened, followed by controlling the negative bias voltage for the substrate to −60 V and adjusting the vacuum degree in the vacuum oven to about 3.5 Pa. $N_2$ was introduced in such way to maintain a constant pressure. Two sets of AlCr targets (Al:Cr=70:30) were used and their currents were adjusted to 130 A for a period of 75 min.

Then, the two sets of AlCr targets were continued to operate with the preset parameters, and the current of a set of AlTiSi targets (Al:Ti:Si=60:30:10) was adjusted to 120 A, with the negative bias voltage for the substrate still being −60 V, for a period of 55 min.

Afterward, one set of the AlCr targets were turned off, and the remaining AlTi targets and the AlTiSi targets were continued to operate with the preset parameters for a period of 200 min.

Finally, the AlTi targets and the set of the AlTiSi targets were turned off, the bias voltage power supply was turned off and the $N_2$ flow valve was closed to complete the coating process. The cutting tool was cooled along with the oven to 25° C.; and removed.

The above descriptions are only preferred embodiments of the present invention and are not intended to limit the present invention. Any modification, equivalent replacement, and improvement made within the spirit and principle of the present invention shall fall within the protection scope of the claims of the invention.

What is claimed is:

1. An ion source enhanced AlCrSiN coating with a gradient Si content and a gradient grain size, comprising sequentially an AlCrSiN working layer, an interlayer and an AlCrN bottom layer in order from a surface of the ion source enhanced AlCrSiN coating to a substrate, wherein from the AlCrN bottom layer to the AlCrSiN working layer, the Si content in the interlayer is gradually increased, and the interlayer comprises a texture changing from coarse columnar crystals to fine nanocrystals and amorphous body, the texture sequentially comprises coarse columnar crystals, fine columnar crystals and fine equiaxed crystals, the grain size of the interlayer is gradually decreased, in the interlayer, the Si content is gradually increased from 1 wt. % to 5 wt. %, and the grain size is gradually decreased from 60 nm to 20 nm.

2. The ion source enhanced AlCrSiN coating with the gradient Si content and the gradient grain size according to claim 1, wherein Cr in the ion source enhanced AlCrSiN coating is completely or partially replaced by Ti to obtain an AlTiSiN coating or an AlCrTiSiN coating.

3. The ion source enhanced AlCrSiN coating with the gradient Si content and the gradient grain size according to claim 1, wherein the substrate is subjected to an etching and cleaning in advance, comprising the steps of:
evacuating a vacuum oven for a multi-arc ion plating to $2.0 \times 10^{-4}$ Pa, and then introducing Ar gas to the vacuum oven to adjust a pressure of the vacuum oven to 4.0 Pa and heating the vacuum oven to 450° C., turning on a cleaning Ti target, and then turning on an anode target, so as to form positive and negative electrodes with the cleaning Ti target to achieve a traction of electron motion, allowing electrons to collide with the Ar gas to generate $Ar^+$, and then controlling a negative bias voltage to −200 V, thereby attracting the $Ar^+$ to perform an ion bombardment on a surface of the substrate for a bombardment time of 45 min.

4. The ion source enhanced AlCrSiN coating with the gradient Si content and the gradient grain size according to claim 1, wherein the ion source enhanced AlCrSiN coating has a coefficient of friction of 0.36-0.40 at room temperature.

5. The ion source enhanced AlCrSiN coating with the gradient Si content and the grain size according to claim 1, wherein the ion source enhanced AlCrSiN coating has a microhardness greater than 3800 HK.

6. A method for preparing the ion source enhanced AlCrSiN coating with the gradient Si content and the gradient grain size according to claim 1, wherein the AlCrSiN coating is deposited by the steps of:
(1) evacuating a vacuum oven to a background vacuum of $1 \times 10^{-4}$ to $2 \times 10^{-4}$ Pa, and raising a temperature of the vacuum oven to 480° C.;
(2) introducing Ar gas to the vacuum oven, controlling a vacuum degree in the vacuum oven to 4.0 Pa and controlling a negative bias voltage for the substrate to −200 V, and then turning on a Ti target and controlling a target current of the Ti target to 80 A, followed by performing an etching and cleaning on a surface of the substrate by a high-energy ion bombardment at the negative bias voltage for the substrate of −200 V for a cleaning time of 45 min;
(3) turning off the Ti target and introducing nitrogen gas to the vacuum oven, controlling the negative bias voltage for the substrate to −60 V and adjusting the vacuum degree in the vacuum oven to 3.5 Pa, the nitrogen gas being introduced in such way to maintain a constant pressure at the vacuum degree of 3.5 Pa, using two sets of AlCr targets, and adjusting currents of the two sets of the AlCr targets to 130 A for a period of 77 min;
(4) continuously operating the two sets of the AlCr targets with the preset parameters, and adjusting a target current of an AlCrSi target to 130 A with the negative bias voltage for the substrate still being −60 V for a period of 58 min;

(5) turning off one set of the AlCr targets, and continuously operating the remaining AlCr targets and the AlCrSi target with the preset parameters for a period of 88 min; and (6) turning off the two sets of the AlCr targets, and continuously operating the AlCrSi target with the preset parameters for a period of 120 min.

7. The method according to claim 6, wherein each AlCr target of the two sets of the AlCr targets has an atomic ratio of Al to Cr of 70:30.

8. The method according to claim 6, wherein the AlCrSi target has an atomic ratio of Al:Cr:Si of 60:30:10.

9. A cutting tool comprising the ion source enhanced AlCrSiN coating according to claim 1.

* * * * *

UNITED STATES PATENT AND TRADEMARK OFFICE
CERTIFICATE OF CORRECTION

PATENT NO. : 10,941,479 B2  
APPLICATION NO. : 16/642031  
DATED : March 9, 2021  
INVENTOR(S) : Shihong Zhang et al.

Page 1 of 1

It is certified that error appears in the above-identified patent and that said Letters Patent is hereby corrected as shown below:

On the Title Page

Item (71) Applicants should read:
(--ANHUI UNIVERSITY OF TECHNOLOGY
ANHUI DUOJINGTUCENG TECHNOLOGY CO., LTD.
ANHUI HUALING AUTOMOBILE CO., LTD.--)

Instead of:
ANHUI UNIVERSITY OF TECHNOLOGY
ANHUI DUOJINTUCENG TECHNOLOGY CO. LTD.
ANHUI HUALING AUTOMOBILE CO., LTD.

Item (73) Assignees should read:
(--ANHUI UNIVERSITY OF TECHNOLOGY
ANHUI DUOJINGTUCENG TECHNOLOGY CO., LTD.
ANHUI HUALING AUTOMOBILE CO., LTD.--)

Instead of:
ANHUI DUOJINTUCENG TECHNOLOGY CO. LTD.
ANHUI HUALING AUTOMOBILE CO., LTD.
ANHUI UNIVERSITY OF TECHNOLOGY Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*